(12) United States Patent
Ho et al.

(10) Patent No.: US 7,070,915 B2
(45) Date of Patent: Jul. 4, 2006

(54) METHOD AND SYSTEM FOR DRYING A SUBSTRATE

(75) Inventors: Chung-Peng Ho, Austin, TX (US); Kathleen Nafus, Austin, TX (US); Kaz Yoshioka, Austin, TX (US); Richard Yamaguchi, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 51 days.

(21) Appl. No.: 10/650,729

(22) Filed: Aug. 29, 2003

(65) Prior Publication Data

US 2005/0046934 A1    Mar. 3, 2005

(51) Int. Cl.
  *G03C 5/00* (2006.01)
(52) U.S. Cl. ............... 430/322; 430/330; 430/329; 355/67; 355/72
(58) Field of Classification Search .......... 430/322, 430/330, 329; 355/67, 72
  See application file for complete search history.

(56) References Cited

U.S. PATENT DOCUMENTS 5,986,742 A    11/1999   Straaijer et al.

2002/0163629 A1    11/2002   Switkes et al.
2005/0007567 A1*    1/2005   Pierrat et al. ............... 355/18
2005/0036184 A1*    2/2005   Yeo et al. ..................... 359/15

OTHER PUBLICATIONS

Owen et al., "1/8 µm optical lithography," Journal of Vacuum Science and Technology, B 10(6), 3032-3036 (1992).
Switkes et al., "Immersion lithography at 157 nm," Journal of Vacuum Science and Technology, B 19(6), 2353-2356 (2001).
Hoffnagle et al., "Liquid immersion deep-ultraviolet interferometric lithography," Journal of Vacuum Science and Technology, B 17(6), 3306-3309 (1999).

* cited by examiner

*Primary Examiner*—John A. McPherson
*Assistant Examiner*—Daborah Chacko-Davis
(74) *Attorney, Agent, or Firm*—Oblon, Spivak, McClelland, Maier & Neustadt, P.C.

(57) ABSTRACT

A method and system is described for drying a thin film on a substrate following liquid immersion lithography. Drying the thin film to remove immersion fluid from the thin film is performed prior to baking the thin film, thereby reducing the likely hood for interaction of immersion fluid with the baking process. This interaction has been shown to cause non-uniformity in critical dimension for the pattern formed in the thin film following the developing process.

34 Claims, 6 Drawing Sheets

METHOD AND SYSTEM FOR DRYING A SUBSTRATE

BACKGROUND OF THE INVENTION

1. Field of the Invention

The present invention relates to a method and system for drying a substrate, and, more particularly, to a method and system for drying a substrate following exposure during immersion lithography.

2. Description of Related Art

In material processing methodologies, pattern etching comprises the application of a patterned mask of radiation-sensitive material, such as photoresist, to a thin film on an upper surface of a substrate, and transferring the mask pattern to the underlying thin film by etching. The patterning of the radiation-sensitive material generally involves coating an upper surface of the substrate with a thin film of radiation-sensitive material and then exposing the thin film of radiation-sensitive material to a radiation source through a reticle (and associated optics) using, for example, a photolithography system. Then a developing process is performed, during which the removal of the irradiated regions of the radiation-sensitive material occurs (as in the case of positive photoresist), or the removal of non-irradiated regions occurs (as in the case of negative resist) using a base developing solution, or solvent. The remaining radiation-sensitive material exposes the underlying substrate surface in a pattern that is ready to be etched into the surface. Photolithographic systems for performing the above-described material processing methodologies have become a mainstay of semiconductor device patterning for the last three decades, and are expected to continue in that role down to 65 nm resolution, and less.

The resolution ($r_o$) of a photolithographic system determines the minimum size of devices that can be made using the system. Having a given lithographic constant $k_1$, the resolution is given by the equation $$r_o = k_1 \lambda / NA, \quad (1)$$

where $\lambda$ is the operational wavelength, and NA is the numerical aperture given by the equation $$NA = n \cdot \sin \theta_o. \quad (2)$$

Angle $\theta_o$ is the angular semi-aperture of the system, and n is the index of refraction of the material filling the space between the system and the substrate to be patterned.

Following equation (1), conventional methods of resolution improvement have lead to three trends in photolithographic technology: (1) reduction in wavelength $\lambda$ from mercury g-line (436 nm) to the 193 nm excimer laser, and further to 157 nm and the still developing extreme-ultraviolet (EUV) wavelengths; (2) implementation of resolution enhancement techniques (RETs) such as phase-shifting masks, and off-axis illumination that have lead to a reduction in the lithographic constant $k_1$ from approximately a value of 0.6 to values approaching 0.4; and (3) increases in the numerical aperture (NA) via improvements in optical designs, manufacturing techniques, and metrology. These latter improvements have created increases in NA from approximately 0.35 to values greater than 0.75, with 0.85 expected in the next few years. However, as can be seen in equation (2), for conventional free-space optical systems (i.e., n=1), there is a theoretical limit bounding NA to values of one or less.

Immersion lithography provides another possibility for increasing the NA of an optical system, such as a lithographic system. In immersion lithography, a substrate is immersed in a high-index of refraction fluid (also referred to as an immersion medium), such that the space between a final optical element and the substrate is filled with a high-index fluid (i.e., n>1). Accordingly, immersion provides the possibility of increasing resolution by increasing the NA beyond the free-space theoretical limit of one (see equations (1), and (2)).

Due to the inherently lower cost, relatively easy implementation to current exposure tools, and high potential to reach very high resolution with reasonable process latitude, liquid immersion lithography has emerged as a very promising candidate for semiconductor patterning technology down to 65 nm, 45 nm, and beyond. However, immersion lithography technology still faces numerous challenges including selection of an immersion fluid that is compatible with current and future photoresists yet free of optical defects (such as micro-bubbles) and sufficiently transparent, and selection of an immersion process that facilitates integration with existing exposure systems and track systems. Moreover, problems associated with introducing a liquid to the photolithography process must be identified, and new system components and methods for solving or reducing such problems must be developed.

SUMMARY OF THE INVENTION

One object of the present invention is to address any or all of the above-described challenges of immersion lithography technology.

Another object of the present invention is to identify problems associated with introducing a liquid to the photolithographic process, and to provide system components and/or process steps for solving or reducing such problems.

Yet another object of the present invention is to improve the uniformity of a pattern formed in a thin film by immersion lithography.

A method and system for drying a substrate following immersion lithography is described.

These and other objects of the present invention are provided by a method and system for treating an exposed thin film on a substrate following liquid immersion lithography. The method includes drying the substrate to remove immersion liquid from the exposed thin film on the substrate.

In another aspect, a method of transferring a pattern to a thin film of radiation-sensitive material on a substrate using photolithography includes exposing the thin film to a radiation source in a liquid immersion lithography system, and drying the substrate following the exposure in the liquid immersion lithography system.

In another aspect, a method of patterning a substrate includes forming a thin film of radiation-sensitive material on the substrate; exposing the thin film to a pattern in a liquid immersion lithography system; drying the substrate following the exposure in the liquid immersion lithography system; baking the substrate following the drying; and developing the thin film on the substrate to form the pattern in the thin film by subjecting the substrate to a developing solution.

In another aspect, a system for patterning a radiation-sensitive material on a substrate for semiconductor manufacturing includes a liquid immersion lithography system configured to expose the thin film to a pattern; a track system coupled to the liquid immersion lithography system and configured for coating the substrate with the thin film prior to the exposure, and developing the pattern in the thin film following the exposure; and a drying system coupled to at least one of the liquid immersion lithography system and the track system, wherein the drying system is configured to substantially remove immersion fluid from the thin film.

In another aspect, a system for irradiating a pattern on a thin film of radiation-sensitive material on a substrate includes a liquid immersion lithography system configured to expose the thin film on the substrate to the pattern; and a drying system coupled to the liquid immersion lithography system, and configured to dry the thin film following the exposure.

DETAILED DESCRIPTION OF EXEMPLARY EMBODIMENTS

Embodiments of the present invention will be described in detail below with reference to the accompanying drawings. As an embodiment according to the present application, a patterning system for forming a pattern in a thin film on a substrate, such as a semiconductor substrate for electronic device manufacturing, is described below.

In conventional lithography processes used for patterning a thin film of radiation-sensitive material, such as chemically amplified photoresist, a substrate is coated with the thin film of radiation-sensitive material, and it is cured in a post-application bake (PAB). The cured thin film is then exposed to a pattern in the lithography system, followed by a cure in a post-exposure bake (PEB) to, for example, promote acid diffusion to control resolution and eliminate standing waves formed in the vertical profile of the pattern sidewalls. Thereafter, the exposed thin film is developed in a developing solution, and rinsed to remove any defects. In current integrated circuit (IC) manufacturing projections using this conventional lithography process, patterning technology at 0.15 micron is expected to achieve approximately 20 million transistors per square centimeter. Assuming a square piece of real estate on a silicon substrate for preparing a transistor, the above projections translate into a lateral dimension of approximately 2200 nm.

With the advent of advanced lithography technology (such as liquid immersion technology) for critical dimensions less than 65 nm, scaling the above results for conventional photolithography enables achieving a lateral dimension for a transistor less than 1000 nm. In evaluating liquid immersion lithography processes, however, the present inventors determined that performing liquid immersion lithography using the conventional PEB step described above leads to non-uniform characteristics of the patterned thin film. In particular, the present inventors discovered that, when using liquid immersion lithography systems, the exposed thin film on the substrate retains some immersion fluid on a surface thereof, which, in general, is non-uniformly distributed upon the surface due to the unstable movement of a fluid on a flat surface. Once the substrate exits the exposure system and passes to the PEB system, the subsequent interaction between the non-uniformly distributed immersion fluid with the bake process leads to a non-uniform distribution of the pattern formed in the thin film.

More specifically, the present inventors discovered that the non-uniformly distributed immersion fluid can affect a non-uniform temperature distribution during the baking process and, ultimately, lead to a non-uniform distribution of the critical dimension (CD) for the pattern formed in the thin film. For example, in regions where excess immersion fluid is retained, a decrease in the film temperature, relative to other regions in the thin film, is expected during the PEB process. This leads to localized regions of the film where the promotion of acid diffusion is different than other regions, thereby diminishing resolution control and allowing vertical profile standing waves in localized regions of the thin film. This further leads to non-uniform characteristics of actual devices formed on the substrate.

Figure 1:
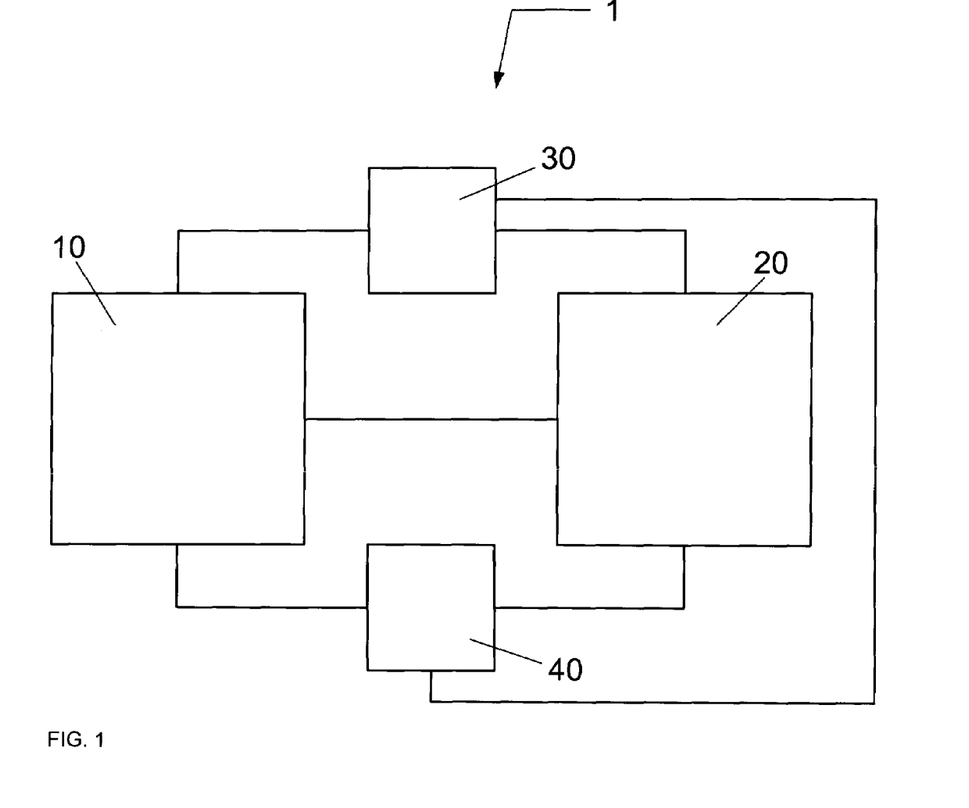
FIG. 1 presents a schematic view of a patterning system according to an embodiment of the present invention.

According to an embodiment of the present invention, FIG. 1 presents a patterning system for patterning a substrate using liquid immersion lithography that reduces or eliminates any or all of the above identified problems by drying the substrate following exposure in the liquid immersion lithography system. As shown in FIG. 1, a patterning system 1 includes a track system 10, a liquid immersion lithography system 20 coupled to the track system 10, and a drying system 30 coupled to at least one of the track system 10 and the liquid immersion lithography system 20. Additionally, a controller 40 can be coupled to the track system 10, the liquid immersion lithography system 20, and the drying system 30, and can, for example, be configured to control each identified system according to a process recipe.

Figure 2:
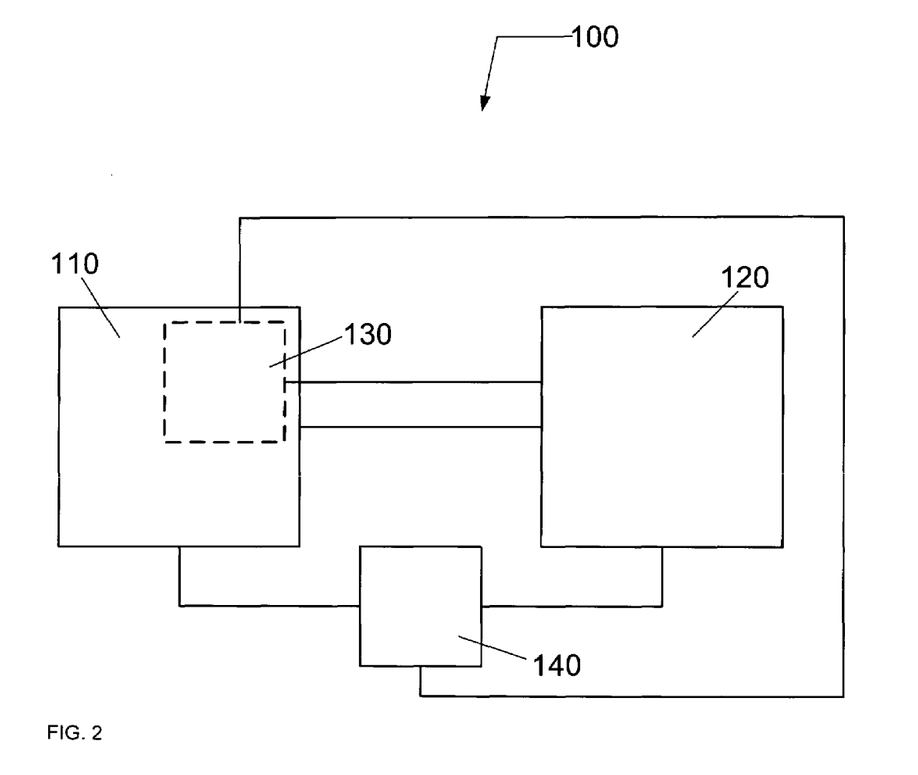
FIG. 2 presents a schematic view of a patterning system according to another embodiment of the present invention.

Alternatively, as shown in FIG. 2, a patterning system 100 comprises a track system 110, a liquid immersion lithography system 120 coupled to the track system 110, and a drying system 130 coupled to at least one of the track system 110 and the liquid immersion lithography system 120, wherein the drying system 130 resides as part of the track system 110. Additionally, a controller 140 can be coupled to the track system 110, the liquid immersion lithography system 120, and the drying system 130, and can, for example, be configured to control each identified system according to a process recipe.

Figure 3:
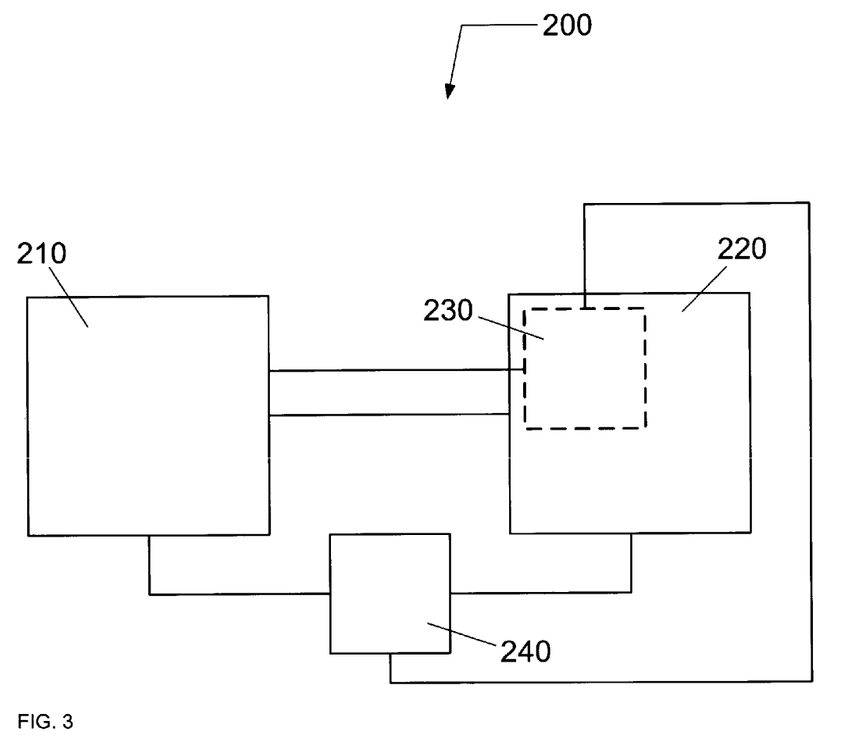
FIG. 3 presents a schematic view of a patterning system according to another embodiment of the present invention.

Still alternatively, as shown in FIG. 3, a patterning system 200 includes a track system 210, a liquid immersion lithography system 220 coupled to the track system 210, and a drying system 230 coupled to at least one of the track system 210 and the liquid immersion lithography system 220, wherein the drying system 230 resides as part of the liquid immersion lithography system 220. Additionally, a controller 240 can be coupled to the track system 210, the liquid immersion lithography system 220, and the drying system 230, and can, for example, be configured to control each identified system according to a process recipe.

The track system 10 (110, 210) can include a plurality of units utilized for forming the pattern in the thin film of radiation-sensitive material. The track system 10 (110, 210) can be configured for processing substrate sizes of 100 mm, 200 mm, 300 mm, and greater. Moreover, the track system 10 can be configured for processing 248 nm resists, 193 nm resists, 157 nm resists, EUV resists, (top/bottom) anti-reflective coatings (TARC/BARC), and top coats. The plurality of units in the track system 10 (110, 210) can include at least one of a film coating unit, a post application bake (PAB) unit, a post-exposure bake (PEB) unit, an adhesion coating unit, a cooling unit, a cleaning unit, a rinsing unit, a developing unit, and a transfer system for transporting substrates to and from units and substrate cassettes. For example, the track system 10 can comprise a Clean Track ACT 8, or ACT 12 resist coating and developing system commercially available from Tokyo Electron Limited (TEL). Other systems and methods for forming a photoresist film on a substrate are well known to those skilled in the art of spin-on resist technology.

Referring still to FIGS. 1–3, the liquid immersion lithography system 20 (120,220) can include at least one of a radiation source, an imaging system, a scanning system, a projection lens system, and a substrate holder. For example, the liquid immersion lithography system can be configured in a manner similar to the system described in U.S. Patent Application No. US 2002/0163629 A1 entitled "Methods and apparatus employing an index matching medium" by Switkes et al. Additionally, for example, the liquid immersion lithography system can be configured in a manner similar to the system described in U.S. Pat. No. 5,986,742 entitled "Lithographic scanning exposure projection apparatus" by Straaijer et al. (assigned to ASML Lithography B.V.), wherein the lithography system is further configured to retain an immersion fluid in the space residing between the projection lens system and the substrate as described in greater detail for the interference lithographic systems given in Hoffnagle, "Liquid immersion deep-ultraviolet interferometric lithography", Journal of Vacuum Science & Technology B 17(6), 3303–3309 (1999); Switkes & Rothschild, "Immersion lithography at 157 nm", Journal of Vacuum Science & technology B 19(6), 2353–2356 (2001); and Owen et al., "⅛ mm optical lithography", Journal of Vacuum Science & technology B 10(6), 3032–3036 (1992). Additionally, for example, the liquid immersion lithography system 20 can be derived from any suitable conventional stepping lithographic system, or scanning lithographic system.

Although the foregoing description is given with reference to an imaging system for pattern transfer in semiconductor manufacturing, it should be understood that the liquid immersion lithography system 20 could alternatively comprise an interferometric lithography system as described in Hoffnagle et al. (1999), and Switkes et al. (2001). The entire contents of each of the above-described references is hereby incorporated herein by reference.

Figure 4:
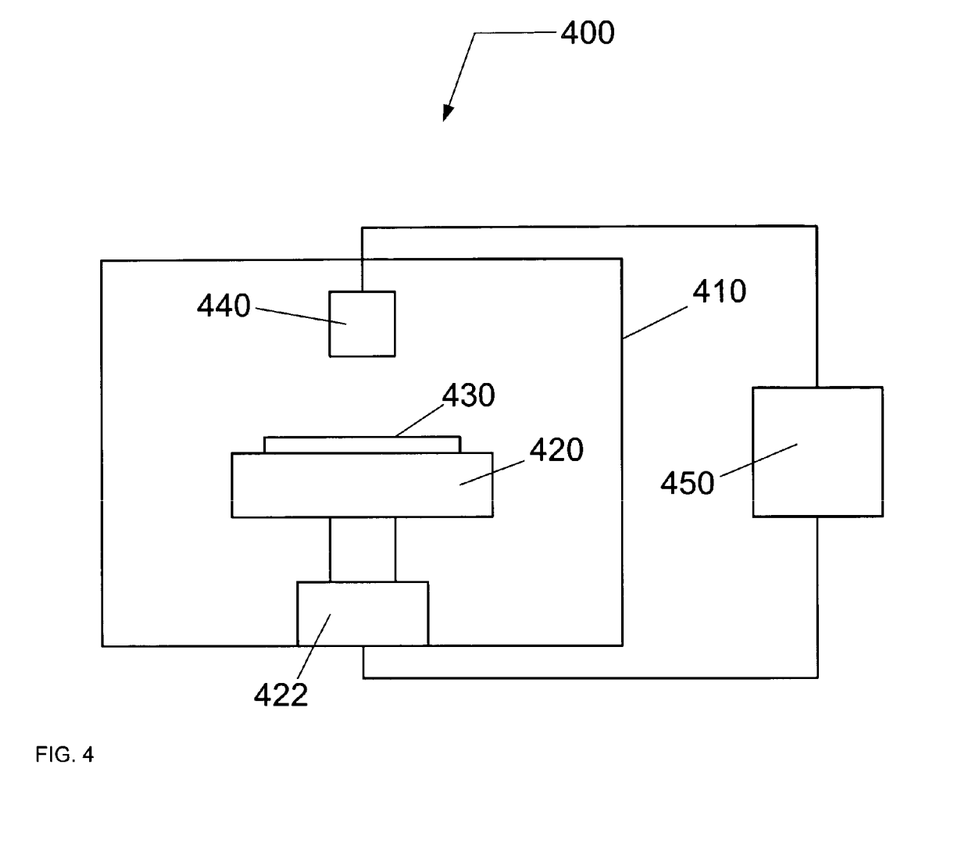
FIG. 4 shows a drying system according to another embodiment of the present invention.

Referring now to FIG. 4, the drying system 30 (130, 230) includes a drying unit 400 having a drying chamber 410, and a substrate holder 420 coupled to the drying chamber 410 and configured to support a substrate 430. Substrate holder 420 is further configured to rotate (or spin) substrate 430 during the drying process. A drive assembly 422 coupled to the substrate holder 420 is configured to rotate the substrate holder 420. The drive assembly 422 can, for example, permit setting the rotation rate, and the rate of acceleration of the substrate holder rotation. Additionally, drying unit 400 can further include a fluid dispensing system 440 for dispensing a drying fluid, such as alcohol (e.g., isopropyl alcohol), onto the substrate surface to aid in displacing the immersion fluid thereon. Furthermore, the drying unit 400 can include a control system 450 coupled to the drying unit 410, the drive assembly 422, and the fluid dispensing system 440, wherein it can be configured to execute one or more process steps for the drying process according to a process recipe.

Referring again to FIGS. 1 through 3, controller 40 (140, 240) includes a microprocessor, memory, and a digital I/O port (potentially including D/A and/or A/D converters) capable of generating control voltages sufficient to communicate and activate inputs to the track system 10 (110, 210) and the liquid immersion lithography system 20 (120, 220) as well as monitor outputs from these systems. A program stored in the memory is utilized to interact with the systems 10 and 20 according to a stored process recipe. One example of controller 40 is a DELL PRECISION WORKSTATION 530™, available from Dell Corporation, Austin, Tex. The controller 40 may also be implemented as a general purpose computer such as the computer described with respect to FIG. 6.

Controller 40 may be locally located relative to the track system 10 and the liquid immersion lithography system 20, or it may be remotely located relative to the track system 10 and the liquid immersion lithography system 20 via an internet or intranet. Thus, controller 40 can exchange data with the track system 10 and the liquid immersion lithography system 20 using at least one of a direct connection, an intranet, and the internet. Controller 40 may be coupled to an intranet at a customer site (i.e., a device maker, etc.), or coupled to an intranet at a vendor site (i.e., an equipment manufacturer). Furthermore, another computer (i.e., controller, server, etc.) can access controller 40 to exchange data via at least one of a direct connection, an intranet, and the internet.

Figure 5:
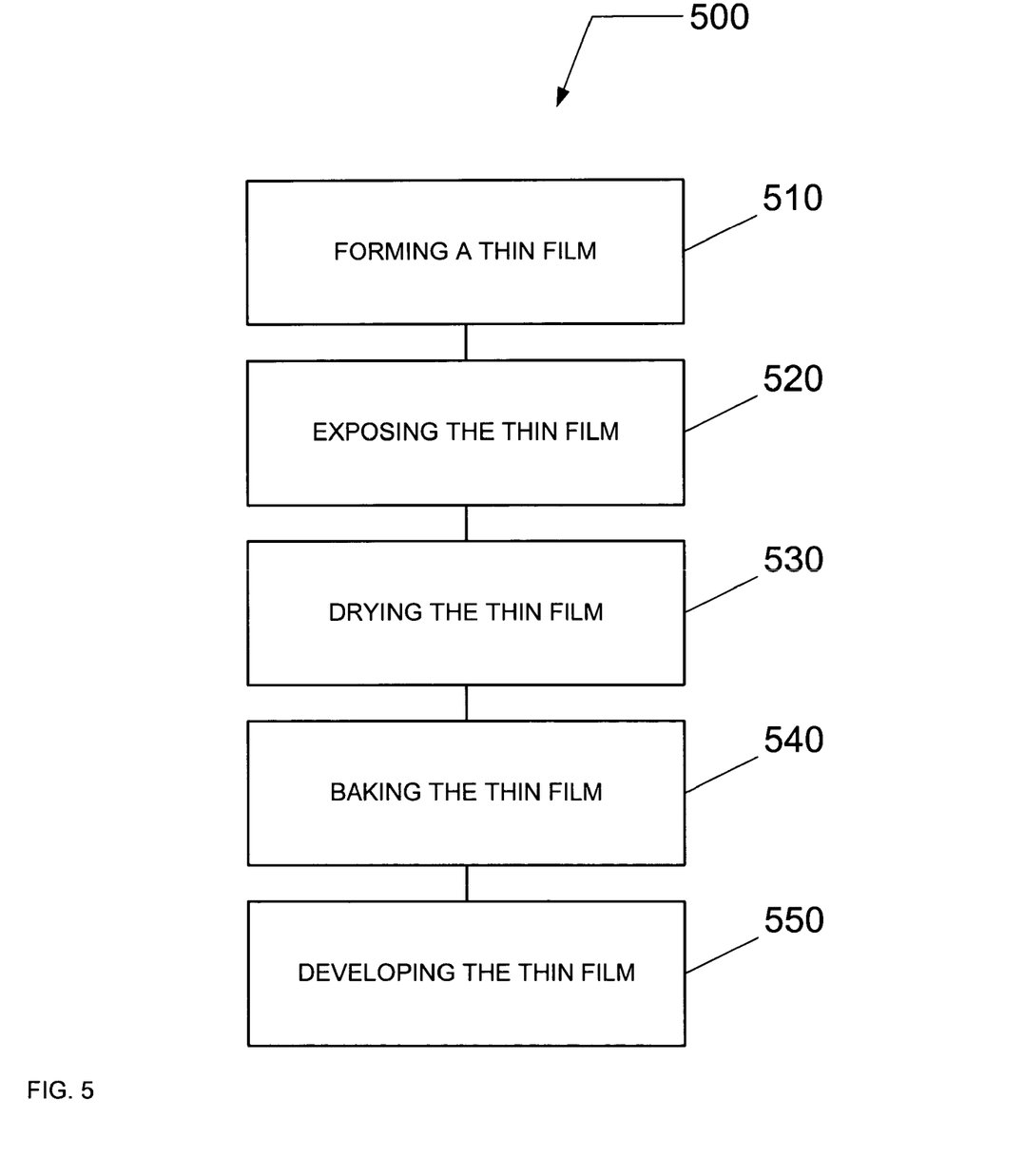
FIG. 5 presents a method of patterning a substrate according to another embodiment of the present invention.

Referring now to FIG. 5, a method of patterning a thin film on a substrate is described. The method of FIG. 5 may be performed by any one of the systems described with respect to FIGS. 1–4. The method includes a flow chart 500 beginning in 510 with forming the thin film of radiation-sensitive material on the substrate. The thin film can be formed using spin coating techniques employed by a track system, such as the one described in FIGS. 1 through 3. Following the coating process, the thin film can, for example, be cured by baking the film in a PAB unit.

In 520, the thin film of radiation-sensitive material is exposed to a pattern in a liquid immersion lithography system, such as any of the systems described above.

In 530, following the radiation exposure, the thin film on the substrate is dried in a drying system, such as the one described in FIG. 4. The drying process includes positioning the substrate on a substrate holder, and rotating the substrate. The substrate can be accelerated to a first rotation rate, and spun for a first period of time until the immersion fluid is removed from the surface of the thin film by centrifugal forces. Alternatively, the substrate can be accelerated to a first rotation rate, and spun for a first period of time, followed by acceleration or deceleration to a second rotation rate, and spinning for a second period of time. For example, the first rotation rate can comprise a low speed rotation rate in order to uniformly spread the immersion fluid across the surface of the thin film, and the second rotation rate can be a high speed rotation rate in order to spin off the immersion fluid. Alternatively, a drying fluid can be dispensed upon the surface of the thin film, either when rotating or not rotating the substrate, in order to displace the immersion fluid. The drying fluid can be in a gaseous state, or a liquid state. The drying fluid can, for example, comprise an alcohol, such as isopropyl alcohol. However, any drying fluid having a vapor pressure higher than that of the immersion fluid can be utilized to aid in removing the immersion fluid from the surface of the thin film. For instance, the immersion fluid can comprise water for 193 nm processes, and perfluoropolyether (PFPE) for 157 nm processes.

In 540, the thin film can be thermally treated in a PEB unit in order to, for example, promote acid diffusion to control pattern resolution, and eliminate standing waves in the vertical profile of the pattern sidewall.

In 550, the thin film can be developed in a base developing solution, or solvent in order to remove the irradiated regions of the radiation-sensitive material (as in the case of positive photoresist), or non-irradiated regions (as in the case of negative photoresist). Thereafter, the developed pattern in the thin film can be rinsed, or cleaned, in order to remove any resist defects, contamination, etc.

Thus, the present inventors have discovered a system and process for drying a substrate during liquid immersion lithography as described above. One advantage that may be obtained by an embodiment of the inventive method or process is that immersion lithography may be used to provide high density integrated circuits, while maintaining uniformity of elements across the integrated circuit. Thus, the present invention may provide a plurality of transistors formed in a semiconductor integrated circuit, each of each of the plurality of transistors having a lateral dimension of less than 1000 nm and including a plurality of features having a critical dimension of less than 65 nm. In such an integrated circuit provided by an embodiment of the invention, the critical dimension of each of the plurality of features is substantially uniform throughout substantially the entire semiconductor-integrated circuit.

Although, the drying process is described for photoresist technologies, it can further be applied to any (top) anti-reflective coating (TARC), such as Clariant AZ Aquatar ARC offered by MicroChemicals GmbH (Schillerstrasse 18, D-89077 Ulm, Germany), contrast enhancement material, or any topcoat that is utilized to protect a photoresist layer, or eliminate thin film interference during lithography.

Figure 6:
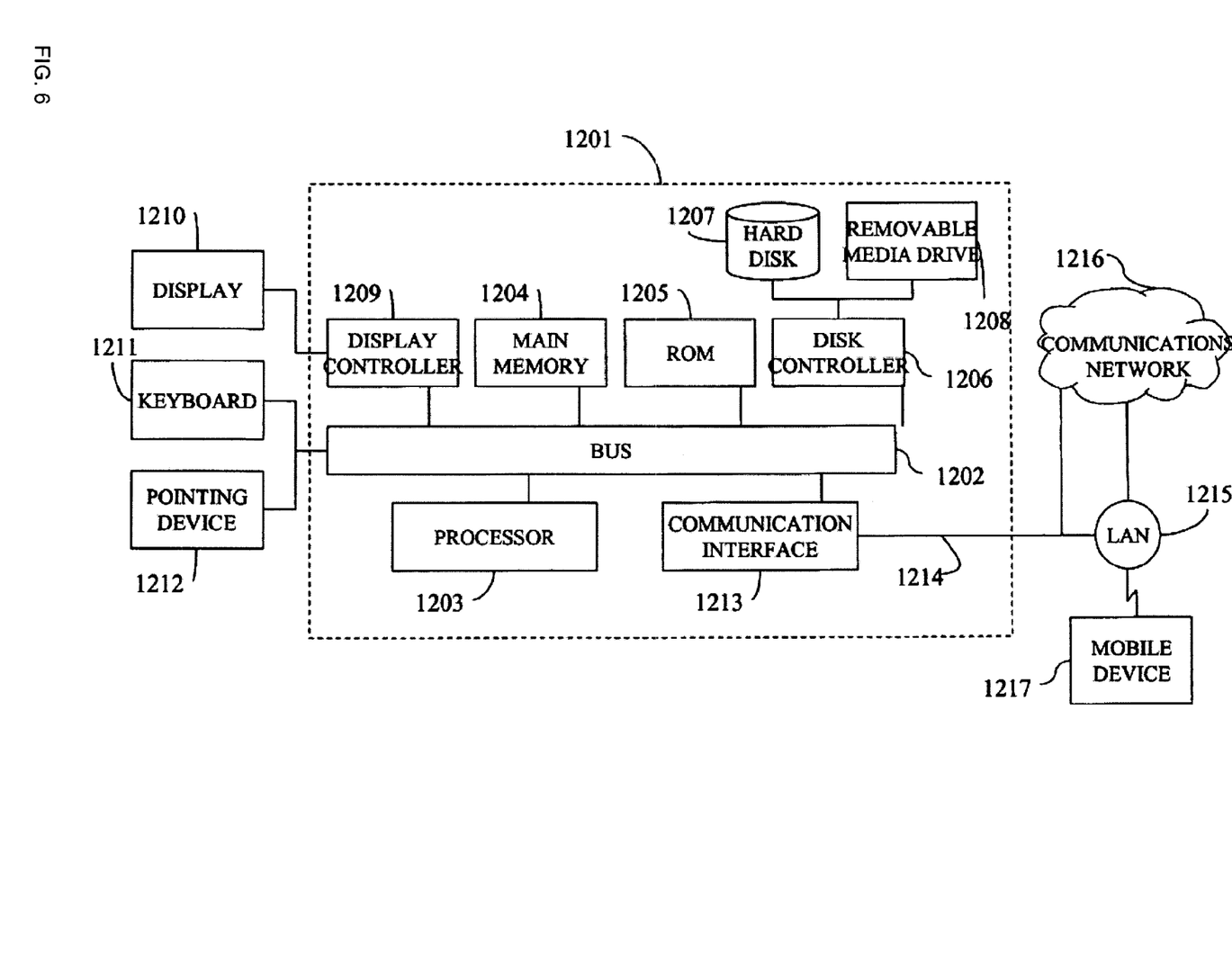
FIG. 6 presents a computer system upon which an embodiment of the present invention can be implemented.

FIG. 6 illustrates a computer system 1201 upon which an embodiment of the present invention may be implemented. The computer system 1201, in whole or in part, may be used as the controller 40 (140, 240, 450) to perform any or all of the functions of the controller described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203. The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors specially designed to process analog signals that have been converted to the digital domain may also be used.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of transferring a pattern to a thin film of radiation-sensitive material on a substrate using photolithography comprising:
    exposing said thin film to a radiation source in a liquid immersion lithography system; and
    drying said substrate following said exposure in said liquid immersion lithography system to remove an immersion fluid from said substrate, wherein said drying said substrate reduces non-uniformity of critical dimension of a pattern in said thin film.

2. A method of transferring a pattern to a thin film of radiation-sensitive material on a substrate using photolithography comprising:
    exposing said thin film to a radiation source in a liquid immersion lithography system; and
    drying said substrate following said exposing in said liquid immersion lithography system to remove an immersion fluid from said substrate, wherein said drying comprises rotating said substrate.

3. The method of claim 1, wherein said drying comprises rotating said substrate at a first rotation rate for a first period of time, and rotating said substrate at a second rotation rate for a second period of time.

4. The method of claim 3, wherein said first rotation rate facilitates distributing said immersion fluid on said thin film, and said second rotation rate facilitates removing said immersion fluid from said thin film.

5. The method of claim 1, further comprising:
    baking said substrate following said drying in order to promote acid diffusion in said thin film.

6. The method of claim 1, wherein said exposing comprises exposing a radiation-sensitive material including at least one of a 248 nm photoresist, a 193 nm photoresist, a 157 nm photoresist, an extreme ultraviolet (EUV) photoresist, an anti-reflective coating, a contrast enhancement material, a top coat for protecting a photoresist, and a top coat for eliminating thin film interference during exposure.

7. The method of claim 1, further comprising:
forming a thin film of radiation-sensitive material on said substrate prior to said exposing;
baking said substrate following said drying; and
developing said thin film on said substrate to form said pattern in said thin film by subjecting said substrate to a developing solution.

8. The method of claim 7, wherein said forming comprises:
coating said substrate with said thin film; and
baking said substrate in order to cure said thin film.

9. The method according to claim 1, wherein said drying the substrate is performed in a drying chamber separate from said liquid immersion lithography system.

10. The method according to claim 1, wherein said drying is performed before any further thermal processing.

11. A method of transferring a pattern to a thin film of radiation-sensitive material on a substrate using photolithography comprising:
exposing said thin film to a radiation source in a liquid immersion lithography system; and
drying said substrate following said exposing in said liquid immersion lithography system to remove an immersion fluid from said substrate, wherein said drying comprises dispensing a drying fluid including alcohol on said substrate.

12. The method of claim 11, wherein said drying comprises dispensing isopropyl alcohol on said substrate.

13. A method of treating an exposed thin film on a substrate following liquid immersion lithography comprising:
drying said substrate to remove immersion fluid from said exposed thin film on said substrate wherein said drying said substrate following said exposure reduces non-uniformity of critical dimension of a pattern in said thin film.

14. The method of claim 13, further comprising:
baking said thin film following said drying in order to cure said exposed thin film.

15. The method of claim 13, wherein said drying comprises rotating said substrate.

16. The method of claim 13, wherein said drying comprises rotating said substrate at a first rotation rate for a first period of time, and rotating said substrate at a second rotation rate for a second period of time.

17. The method of claim 16, wherein said first rotation rate facilitates distributing said immersion fluid on said thin film, and said second rotation rate facilitates removing said immersion fluid from said thin film.

18. The method of claims 13, 15 or 16, wherein said drying comprises dispensing a drying fluid on said substrate.

19. The method of claim 13, wherein said drying comprises dispensing isopropyl alcohol on said substrate.

20. The method of claim 13, wherein said exposing comprises exposing a radiation-sensitive material including at least one of a 248 nm photoresist, a 193 nm photoresist, a 157 nm photoresist, an extreme ultraviolet (EUV) photoresist, an anti-reflective coating, a contrast enhancement material, a top coat for protecting a photoresist, and a top coat for eliminating thin film interference during exposure.

21. The method according to claim 13, wherein said drying the substrate is performed in a drying chamber separate from said liquid immersion lithography system.

22. The method according to claim 13, wherein said drying is performed before any further thermal processing.

23. A system for patterning a thin-film of radiation-sensitive material on a substrate for semiconductor manufacturing comprising:
a liquid immersion lithography system configured to expose said thin film to a pattern; and
a drying system coupled to said liquid immersion lithography system and configured to dry said thin film following exposure by rotating the substrate to substantially remove immersion fluid from said thin film.

24. The system of claim 23, further comprising a track system coupled to said liquid immersion lithography system and configured to coat said substrate with said thin film prior to said exposure, and develop said pattern in said thin film following said exposure,
wherein said drying system is coupled to at least one of said liquid immersion system and said track system.

25. The system of claim 24, wherein said liquid immersion lithography system comprises at least one of a radiation source, an imaging system, a scanning system, a projection lens system, and a substrate holder.

26. The system of claim 24, wherein said drying system is configured to substantially remove at least one of water, and a perfluoropolyether (PFPE).

27. The system of claim 24, wherein said track system comprises at least one of a coating system, a post application (PAB) unit, a post exposure bake (PEB) unit, a cooling unit, a developing unit, a rinsing unit, and a cleaning unit.

28. The system of claim 24, wherein said drying system facilitates drying said substrate to remove immersion fluid from said substrate following said exposure in said liquid immersion lithography system.

29. The system of claim 24, wherein said system is configured to pattern at least one of a 248 nm photoresist, a 193 nm photoresist, a 157 nm photoresist, an extreme ultraviolet (EUV) photoresist, an anti-reflective coating, a contrast enhancement material, a top coat for protecting a photoresist, and a top coat for eliminating thin film interference during exposure.

30. The system of claim 23, wherein said drying system is configured to rotate said substrate at a first rotation rate for a first period of time, and rotate said substrate at a second rotation rate for a second period of time.

31. The system of claim 30, wherein said first rotation rate facilitates distributing said immersion fluid on said thin film, and said second rotation rate facilities removing said immersion fluid from said thin film.

32. The system of claims 24, or 30, wherein said drying system is configured to dispense a drying fluid on said substrate.

33. The system of claim 32, wherein said drying system is configured to dispense isopropyl alcohol.

34. The system according to claim 23, wherein said drying system includes a drying chamber separate from said liquid immersion lithography system.

* * * * *